(12) United States Patent
Shimizu

(10) Patent No.: US 12,474,164 B2
(45) Date of Patent: Nov. 18, 2025

(54) ALIGNMENT METHOD, SHAPE MEASURING METHOD AND SHAPE MEASURING APPARATUS

(71) Applicant: Tokyo Seimitsu Co., Ltd., Hachioji (JP)

(72) Inventor: Tasuku Shimizu, Tokyo (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 307 days.

(21) Appl. No.: 18/446,534

(22) Filed: Aug. 9, 2023

(65) Prior Publication Data

US 2024/0077304 A1    Mar. 7, 2024

(30) Foreign Application Priority Data

Sep. 1, 2022   (JP) ................................ 2022-139513

(51) Int. Cl.
*G01B 11/24*    (2006.01)
*G01B 9/02055*  (2022.01)

(52) U.S. Cl.
CPC ...... *G01B 11/2441* (2013.01); *G01B 9/02055* (2013.01)

(58) Field of Classification Search
CPC ............ G01B 11/2441; G01B 9/02055; G01B 11/028; G01B 11/24; H01L 21/67253; H01L 22/24; G03B 35/02; H04N 13/246
See application file for complete search history.

(56) References Cited

U.S. PATENT DOCUMENTS

| | | | | |
|---|---|---|---|---|
| 5,416,755 A * | 5/1995 | Endo | ...................... | G11B 7/131 369/112.02 |
| 5,831,739 A * | 11/1998 | Ota | ...................... | G03F 9/7092 250/548 |
| 6,002,487 A * | 12/1999 | Shirata | .................. | G03F 9/7003 356/400 |
| 6,221,540 B1 * | 4/2001 | Onoda | .................. | G03F 9/7076 430/22 |
| 2003/0053060 A1 * | 3/2003 | Kim | ...................... | H01L 23/544 257/E23.179 |
| 2013/0217173 A1 * | 8/2013 | Chen | ................ | H01L 21/76229 438/73 |
| 2013/0273721 A1 * | 10/2013 | Wang | ...................... | H10F 77/14 438/478 |
| 2023/0300492 A1 * | 9/2023 | Kambe | .................. | H04N 25/62 257/431 |

FOREIGN PATENT DOCUMENTS

JP      2015-85397 A    5/2015

* cited by examiner

*Primary Examiner* — Jonathan M Hansen
(74) *Attorney, Agent, or Firm* — Birch, Stewart, Kolasch & Birch, LLP

(57) ABSTRACT

The alignment method includes detecting an extending direction of a groove formed on a wafer, based on an image of the wafer picked up by a camera, and performing alignment so as to adjust the extending direction of the groove to be parallel to an array direction of pixels of the camera by relatively rotating the wafer and the camera.

5 Claims, 12 Drawing Sheets

RELATED ART

ALIGNMENT METHOD, SHAPE MEASURING METHOD AND SHAPE MEASURING APPARATUS

CROSS-REFERENCE TO RELATED APPLICATIONS

This application claims the priority benefit under 35 U.S.C. § 119 of Japanese Patent Application No. 2022-139513 filed on Sep. 1, 2022, which is hereby incorporated in its entirety by reference.

BACKGROUND OF THE INVENTION

Field of the Invention

The presently disclosed subject matter relates to an alignment method, a shape measuring method, and a shape measuring apparatus, and relates to a technique of measuring the shape of a groove formed on a wafer.

Description of the Related Art

A dicing apparatus divides a wafer, having a device pattern of a semiconductor device or electronic components formed thereon, into individual chips. The dicing apparatus includes a blade rotated at high speed by a spindle, a table which sucks and holds the wafer, and X, Y, Z, and θ drive units which relatively move the table and the blade. The dicing apparatus performs dicing machining (cutting machining) by cutting the wafer with the blade while relatively moving the blade and the wafer by each drive unit.

Some wafers have two or more devices, each formed by a laminate obtained by laminating an insulator coating film with low dielectric constant (a low-k film) and a functional film which forms a circuit on the surface of a substrate such as a silicon substrate. Since the low-k film is characterized in low mechanical strength and easy separation, dicing may be performed by forming grooves along predetermined segmentation lines through laser ablation processing and by inserting the blade into the grooves.

When the dicing machining as described above is performed, measurement of a machining area (kerf check) is performed in order to confirm the quality of cutting lines and position accuracy of the grooves.

Japanese Patent Application Laid-Open No. 2015-085397 discloses a technique for generating three-dimensional image information on a groove formed on a wafer. In Japanese Patent Application Laid-Open No. 2015-085397, two-dimensional images ($P_0$, $P_1$, $P_2$, . . . ) of a wafer W are picked up, while a camera is gradually moved by a minute distance δ in a Z direction (an up-down direction) as illustrated in FIG. 12. The images ($P_0$, $P_1$, $P_2$, . . . ) are three-dimensionally assembled according to Z coordinates ($Z_0$, $Z_1$, $Z_2$, . . . ) at the time of picking up the respective images, so as to generate three-dimensional image information on a groove G formed on the wafer W.

CITATION LIST

Patent Literature 1: Japanese Patent Application Laid-Open No. 2015-085397

SUMMARY OF THE INVENTION

As described above, a large data amount is required to three-dimensionally assemble the two-dimensional images into three-dimensional image information. Accordingly, a large capacity storage is required for data accumulation. In addition, to process a huge amount of two-dimensional image data, a processing system with excellent processing capability is required. This increases the cost of the data accumulation and processing.

In order to obtain three-dimensional image information on the groove G, the camera is focused on wall surfaces (inclined surfaces) of the groove during image pickup. However, when the inclined surfaces of the groove G are steep, there is a large number of data loss, which makes it difficult to generate an accurate three-dimensional shape of the groove G.

The presently disclosed subject matter has been made in view of such circumstances, and an object of the presently disclosed subject matter is to provide an alignment method, a shape measuring method, and a shape measuring apparatus, which can easily measure the shape of a groove formed on a wafer.

In order to accomplish the above object, an alignment method according to a first aspect of the presently disclosed subject matter includes detecting an extending direction of a groove formed on a wafer, based on a first image of the wafer picked up by a camera, and performing alignment so as to match the extending direction of the groove with an array direction of pixels of the camera by relatively rotating the wafer and camera.

The alignment method according to a second aspect of the presently disclosed subject matter is configured such that, in the first aspect, when the alignment is performed, a direction where the number of pixels per unit length is equal to or more than a prescribed value is adjusted to be parallel to the extending direction of the groove.

A shape measuring method according to a third aspect of the presently disclosed subject matter includes generating a cross-sectional shape of a groove based on a second image of a wafer, picked up by a camera after alignment is performed, by the alignment method according to the first or second aspect.

The shape measuring method according to a fourth aspect of the presently disclosed subject matter is configured such that, in the third aspect, the shape measuring method further includes generating one-dimensional data by one-dimensionally converting the second image of the wafer, picked up by the camera after the alignment is performed, along the extending direction of the groove and the cross-sectional shape of the groove is generated based on the one-dimensional data for each position in a depth direction of the groove.

A shape measuring apparatus according to a fifth aspect of the presently disclosed subject matter includes a detector configured to detect an extending direction of a groove formed on a wafer, based on a first image of the wafer picked up by a camera, a controller configured to perform alignment so as to match the extending direction of the groove with an array direction of pixels of the camera by relatively rotating the wafer and camera, and a cross-sectional shape generator configured to generate a cross-sectional shape of the groove based on a second image of the wafer picked up by the camera after the alignment is performed.

The presently disclosed subject matter can easily generate the cross-sectional shape of a groove formed on the wafer by matching the extending direction of the groove formed on the wafer with the array direction of the pixels of the camera.

DETAILED DESCRIPTION OF THE EMBODIMENTS

An alignment method, a shape measuring method, and a shape measuring apparatus according to an embodiment are described below in accordance with the attached drawings.

Figure 1:
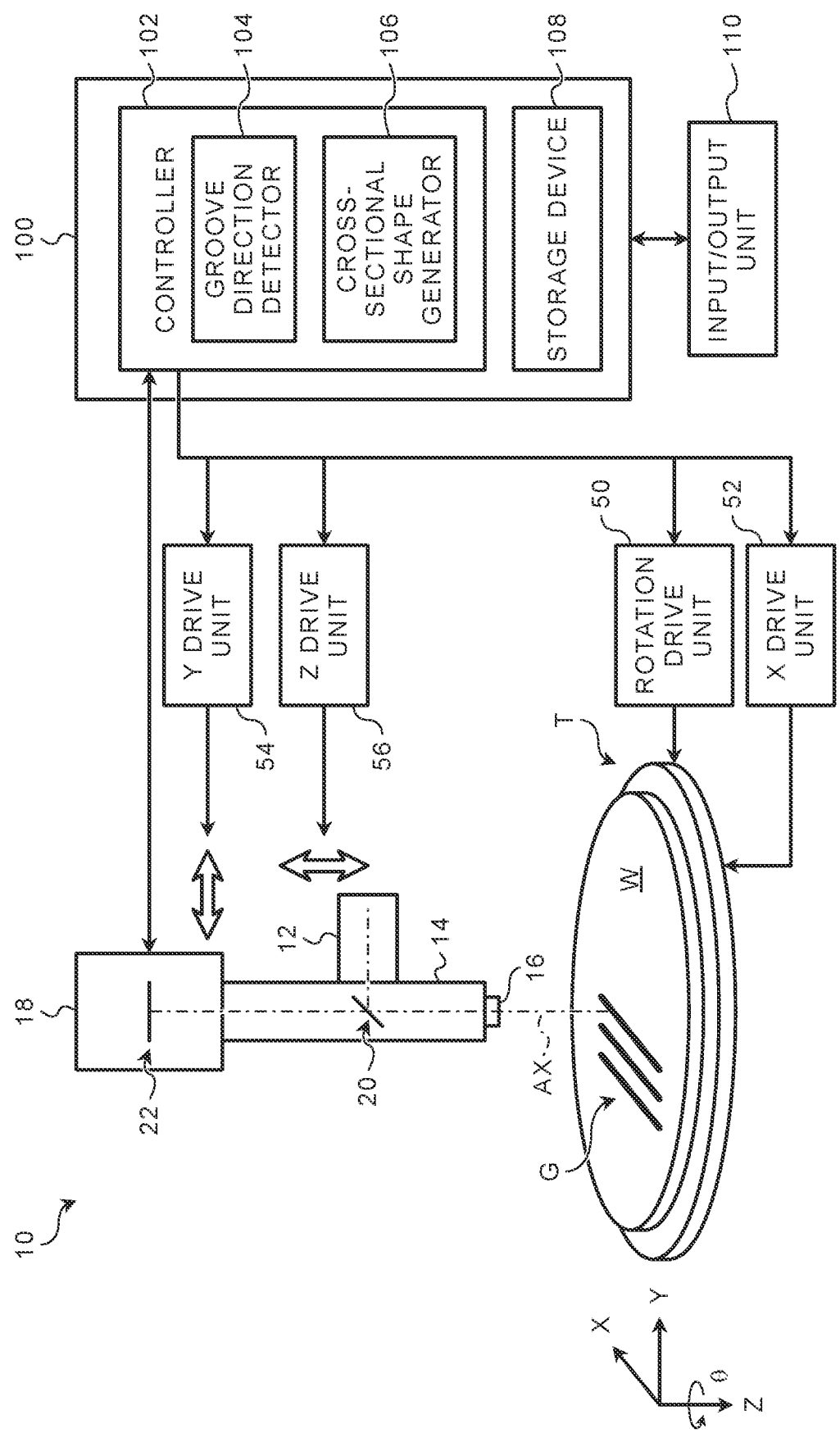
FIG. 1 is a block diagram illustrating a shape measuring apparatus according to an embodiment of the presently disclosed subject matter.

FIG. 1 is a block diagram illustrating a shape measuring apparatus according to an embodiment of the presently disclosed subject matter. In the following description, an XYZ three-dimensional orthogonal coordinate system is used.

A shape measuring apparatus 10 in the present embodiment is an apparatus which picks up an image of a wafer W sucked and held on a table T to measure the shape of a groove G formed on the wafer W. The shape measuring apparatus 10 is, for example, a white interference microscope (for example, "Opt-scope" (registered trademark in Japan) by TOKYO SEIMITSU CO., LTD.).

The table T has a holding surface parallel to an XY plane. The table T sucks and holds the wafer W on the holding surface with a vacuum source (a vacuum generator such as ejectors, and pumps). The wafer W is stuck to a frame (not illustrated) via a dicing tape having an adhesive layer made of adhesives formed on its surface, and is sucked and held on the table T. The frame with the dicing tape stuck thereto is held by a frame holding device installed on the table T. The wafer W may be carried in a mode without using the frame.

The table T is attached to a θ table, and the θ table can be moved around a rotation axis along a Z direction (hereinafter, referred to as a θ direction) by a rotation drive unit 50 including a motor and the like. The θ table is further mounted on an X table. The X table can be moved in an X direction by an X drive unit 52 including a motor, ball screws, and the like.

The shape measuring apparatus 10 is attached to a Z table. The Z table can be moved in the Z direction by a Z drive unit 56 including a motor, ball screws and the like. The Z table is further mounted on a Y table. The Y table can be moved in the Y direction by a Y drive unit 54 including a motor, ball screws and the like.

In the present embodiment, the configuration including a motor, ball screws, and the like is adopted for the X drive unit 52, the Y drive unit 54, and the Z drive unit 56. However, the present embodiment is not limited to this configuration. For the X drive unit 52, the Y drive unit 54, and the Z drive unit 56, a mechanism for reciprocating linear motion, such as a rack and pinion mechanism, can be used.

In the present embodiment, the shape measuring apparatus 10 is moved in YZ directions and the table T is moved in X and θ directions, though the present embodiment is not limited to this configuration. For example, the table T may be moved in the Y and Z directions, as long as the shape measuring apparatus 10 and the table T can be moved relatively in X, Y, Z, and θ directions.

When the shape measuring apparatus 10 is provided in a dicing apparatus (a blade dicer or a laser dicer), the rotation drive unit 50, the X drive unit 52, Y drive unit 54, and the Z drive unit 56 may also be used as a drive unit of the dicing apparatus.

As illustrated in FIG. 1, the shape measuring apparatus 10 includes a light source unit 12, a microscope 14, an interferometric lens 16, and a camera 18.

The light source unit 12 emits white light having a parallel light flux (low coherence light that is low in coherence) under the control of a controller 102. The light source unit 12 includes, for example, a light source which can emit white light, such as light-emitting diodes, semiconductor lasers, halogen lamps, and high-intensity discharge lamps, and a collector lens which converts white light emitted from the light source into a parallel light flux. Here, white light having a wavelength bandwidth of about 20 nm can be used as a light source for white interference microscopes. Accordingly, light-emitting diodes of red, green, and blue colors can be adopted as the light source unit 12, for example.

The white light emitted from the light source unit 12 is reflected to the side of the interferometric lens 16 by a half-mirror 20 disposed in a barrel of the microscope 14.

Figure 2:
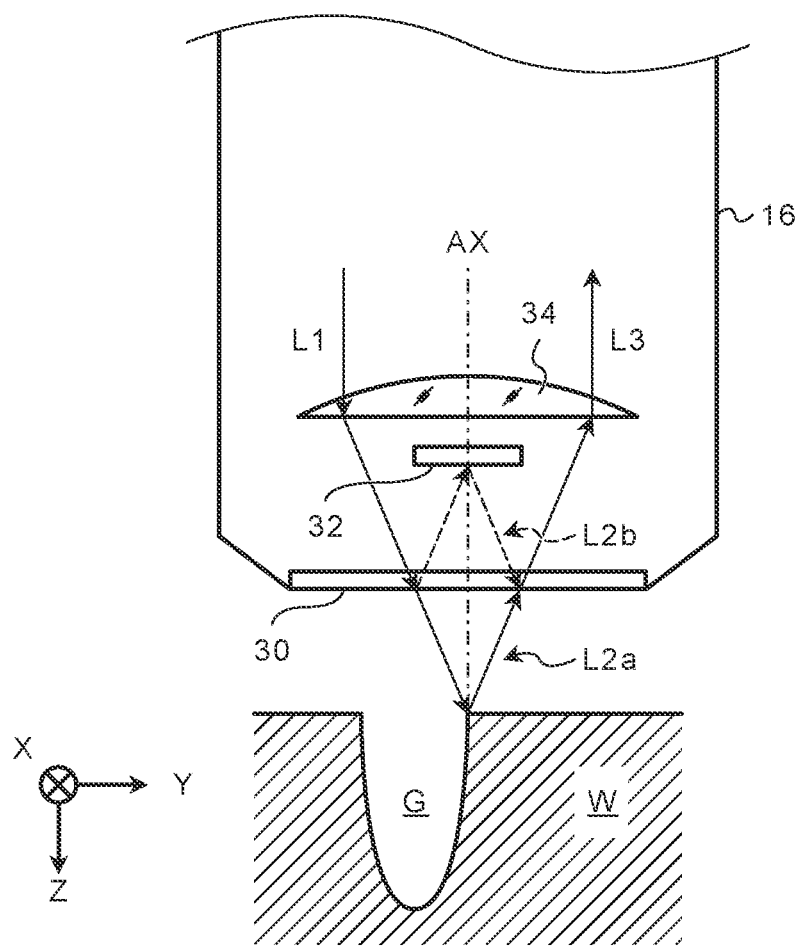
FIG. 2 is a block diagram illustrating an interferometric lens.

FIG. 2 is a block diagram illustrating an interferometric lens. As illustrated in FIG. 2, the interferometric lens 16 includes a beam splitter 30, a reference surface 32, and an objective lens 34.

FIG. 2 illustrates an example of a Mirau-type interference optical system. However, it is possible to adopt other interference optical systems, such as Michelson-type interference optical system or Linnik-type interference optical system as the interferometric lens 16, for example.

As illustrated in FIG. 2, the beam splitter 30 and the objective lens 34 are disposed in order from the wafer W side to a −Z side (upper side). The reference surface 32 is disposed at the position which faces the beam splitter 30 and which is between the beam splitter 30 and the objective lens 34.

The objective lens 34 has a light focusing effect, so that white light L1 incident from the light source unit 12 is concentrated onto the wafer W through the beam splitter 30.

The beam splitter 30 splits part of the white light L1 incident from the objective lens 34 as reference light L2b. The beam splitter 30 allows measurement light L2a, as the remaining white light L1, to pass through and come incident on the wafer W, while reflecting the reference light L2b toward the reference surface 32. After the measurement light L2a passing through the beam splitter 30 irradiates the wafer W, the measurement light L2a is reflected on the wafer W and returns to the beam splitter 30.

As the reference surface 32, a reflective mirror is used to reflect the reference light L2b incident from the beam splitter 30 toward the beam splitter 30, for example. The position of the reference surface 32 in the Z direction can be manually adjusted by a positioning mechanism (for example, a ball screw mechanism, an actuator, etc.). This makes it possible to adjust the optical path length of the reference light L2b (a reference optical path length) between the beam splitter 30 and the reference surface 32. The reference optical path length is adjusted so as to match (including approximately match) the optical path length of the measurement light L2a (a measurement optical path length) between the beam splitter 30 and the wafer W.

The measurement light L2a returning from the wafer W and the reference light L2b returning from the reference surface 32 are combined into multiplexed light L3 in the beam splitter 30, and the multiplexed light L3 reaches the objective lens 34.

The multiplexed light L3 passes through the objective lens 34 and is formed as an image on an imaging surface 22 of the camera 18 using the microscope 14. Specifically, the multiplexed light L3 forms points on a focal surface of the objective lens 34 as image points on the imaging surface of the camera 18.

The camera 18 includes an imaging element of a charge coupled device (CCD) type or a complementary metal oxide semiconductor (CMOS) type. The camera 18 picks up an image of the multiplexed light L3 formed on the imaging surface 22, performs signal processing on an image pickup signal of the multiplexed light L3 obtained by the image pickup, and outputs the picked up image.

In the present embodiment, while the shape measuring apparatus 10 is operated in the Z direction, the wafer W is imaged for each position $Z_i$ in the Z direction. As a result, an image $P_i$ of the groove G formed on the wafer W is obtained for each position $Z_i$ in the Z direction.

As illustrated in FIG. 1, a control device 100 of the shape measuring apparatus 10 includes a controller 102 and a storage device 108. The control device 100 may be a dedicated device or may be, for example, a personal computer or the like.

The controller 102 controls each component of the shape measuring apparatus 10. The controller 102 includes a processor (for example, a central processing unit (CPU), a micro processing unit (MPU), etc.), a memory (for example, read only memory (ROM), random access memory (ROM), etc.).

The controller 102 functions as a groove direction detector 104 and a cross-sectional shape generator 106. The groove direction detector 104 detects a formation direction (hereinafter referred to as an extending direction) of a groove formed on the wafer W. The cross-sectional shape generator 106 generates the cross-sectional shape of the groove G based on one-dimensional data which is obtained from the image of the groove G picked up for each position in the Z direction by the camera 18. Here, the groove direction detector 104 and the cross-sectional shape generator 106 may include a logic circuit other than the controller 102 (for example, a field programmable gate array (FPGA), etc.).

The storage device 108 stores the images picked up by the camera 18, measurement results, or the like. The storage device 108 includes, for example, a hard disk drive (HDD), a solid state drive (SSD), or the like.

The control device 100 is connected to an input/output unit 110. The input/output unit 110 includes, for example, an operation unit and a display unit. The operation unit is a device which receives operation input from a user, and includes, for example, a keyboard, a pointing device, or the like. The display unit is a device which displays the measurement results by the shape measuring apparatus 10, a graphical user interface (GUI) for operation of the shape measuring apparatus 10, and the like, and includes, for example, a liquid crystal display.

In the present embodiment, the two-dimensional image $P_i$ of the wafer W picked up by the camera 18 is converted into a one-dimensional image along the extending direction of the groove G to obtain one-dimensional data. The one-dimensional data for each position $Z_i$ in the Z direction is used to generate the cross-sectional shape of the groove G.

In the present embodiment, before one-dimensional conversion of the two-dimensional image $P_i$, the array direction of the pixels of the camera 18 is aligned with the extending direction of the groove G.

Figure 3:
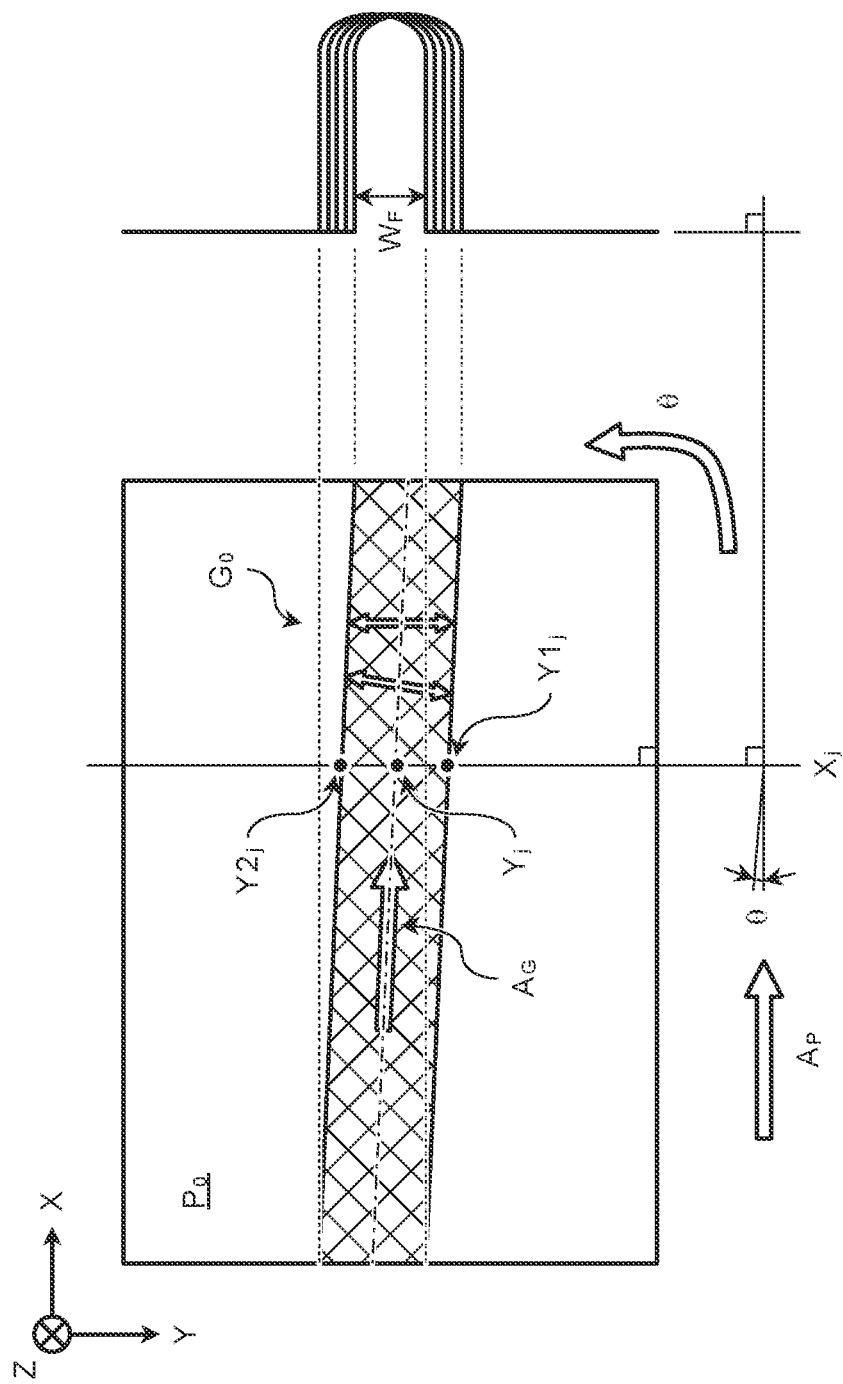
FIG. 3 is a plan view illustrating a state before an array direction of pixels of a camera is aligned with an extending direction of a groove.
Figure 4:
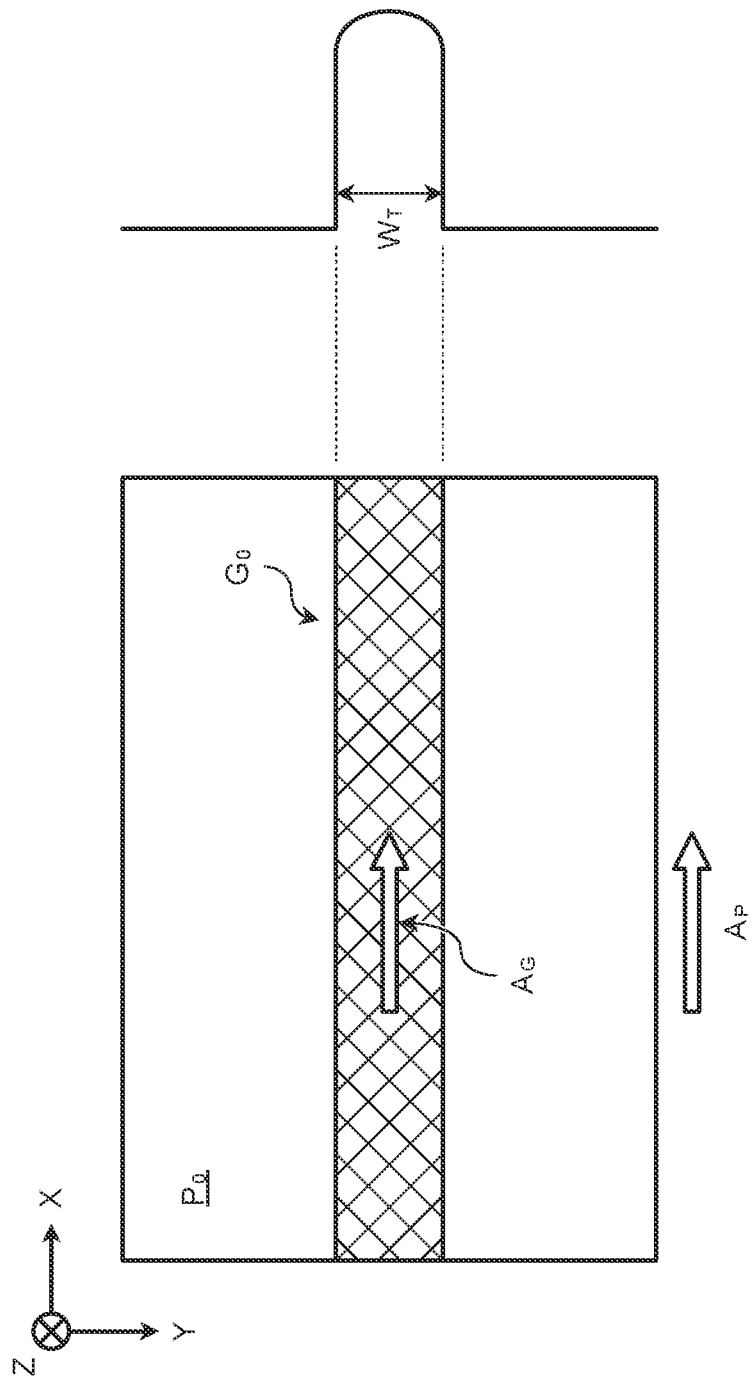
FIG. 4 is a plan view illustrating a state after the array direction of the pixels of the camera is aligned with the extending direction of the groove.

FIGS. 3 and 4 are plan views illustrating the states before and after an array direction $A_P$ of the pixels of the camera 18 is aligned with an extending direction $A_G$ of the groove G. FIGS. 3 and 4 illustrate an image $P_0$ of the surface of the wafer W (i=0).

In FIGS. 3 and 4, for the convenience of description, the array direction $A_P$ of the pixels of the camera 18 is parallel to the X direction. Here, when the pixels are arranged in a lattice-like pattern along two directions which are orthogonal to each other on the imaging surface 22 of the camera 18, the array direction $A_P$ of the pixels may be one of the two directions where the pixels are arrayed.

In actuality, in the image picked up by the shape measuring apparatus 10, the brightness of the wall surfaces of the groove Go becomes a local maximum at positions in the Z direction (depth positions) where the shape measuring apparatus 10 is in-focus, that is, on both edges of the groove Go on the surface (depth $Z_0$). The brightness is lower as the in-focus depth position is shifted away from. In FIG. 3 and FIG. 4, for the convenience of description, a region deeper than the in-focus position on the wall surfaces of the groove Go is illustrated as a strip-shaped region.

In FIG. 3, the extending direction $A_G$ of the groove G (Go) is inclined with respect to the array direction $A_P$ (X direction) of the pixels of the camera 18. In this case, when the detection result of the groove G is projected in the X direction, a width $W_F$ of the groove G becomes narrower than its actual width.

Accordingly, the controller 102 detects the extending direction $A_G$ of the groove G by the groove direction detector 104 and calculates an inclination angle θ of the extending direction $A_G$ of the groove G with respect to the array direction $A_P$ of the pixels of the camera 18. The controller 102 then uses the rotation drive unit 50 to rotate the table T by the inclination angle θ, and adjusts the array direction $A_P$ of the pixels to be parallel to the extending direction $A_G$ of the groove G. This makes it possible to accurately detect the width $W_T$ of the groove G, as illustrated in FIG. 4.

Specifically, the groove direction detector 104 detects, from the image $P_0$, the extending direction $A_G$ of the groove G by the following procedure. More specifically, the groove direction detector 104 detects positions $Y1_j$ and $Y2_j$ of both the edges of the groove G where the brightness is a local maximum for each position $X_j$ in the image $P_0$, and calculates a midpoint $Y_j$ between the points $Y1_j$ and $Y2_j$. The groove direction detector 104 then calculates an approximate line from the position $Y_j$ obtained for each position $X_j$, and uses the direction of the approximate line as the extending direction $A_G$ of the groove G.

A method of obtaining the extending direction $A_G$ of the groove G is not limited to the above method. For example, the extending direction $A_G$ may be obtained by detecting the direction of a street of the wafer W, or may be obtained by detecting an alignment mark indicating the extending direction $A_G$ of the groove G.

In the example described above, when the array of the pixels on the imaging surface 22 of the camera 18 is a lattice-like array, the array direction $A_P$ of the pixel is adjusted to be parallel to the extending direction $A_G$ of the groove G (A). However, the presently disclosed subject matter is not limited to the example (A). For example, the extending direction $A_G$ of the groove G may be adjusted to be parallel to a direction orthogonal to the two directions where the pixels are arrayed, i.e., to a diagonal direction (B). When the pixel array is other than the lattice-like array, the extending direction $A_G$ of the groove G may be adjusted to be parallel to a direction where, for example, the number of pixels per unit length is a prescribed value or more (for example, a direction where the number is the largest) (C). In other words, as in the examples (A) to (C), the number (density) of pixels along the extending direction $A_G$ of the groove G may be secured by matching the array direction $A_P$ of the pixels with the extending direction $A_G$ of the groove G on the imaging surface 22 of the camera 18.

Figure 5:
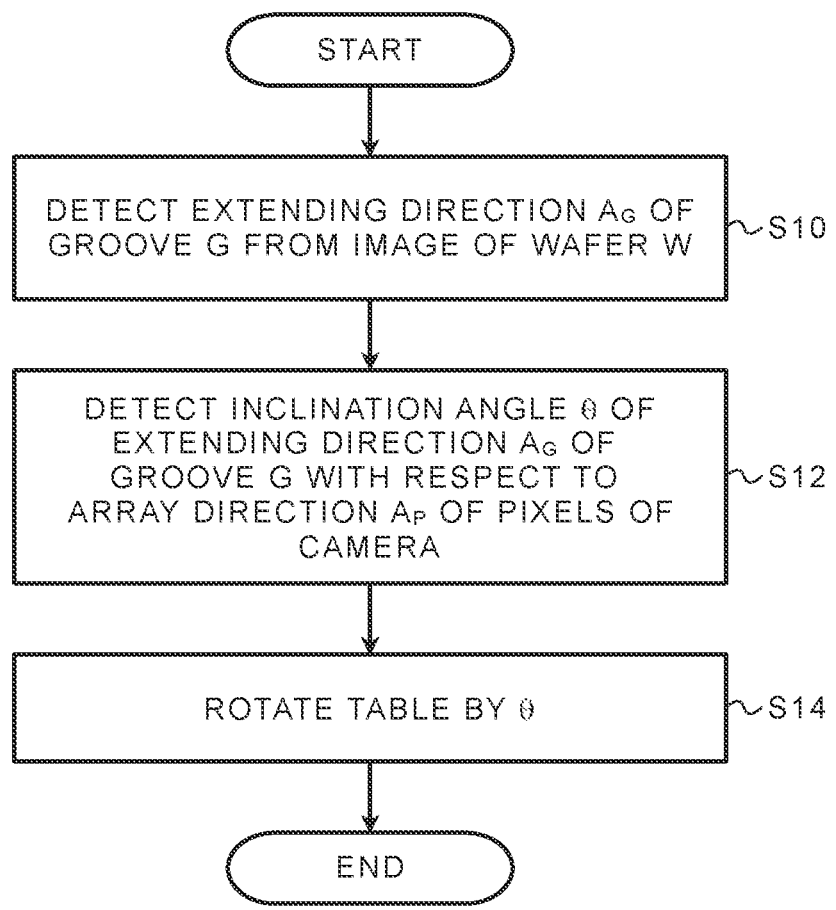
FIG. 5 is a flowchart illustrating an alignment method of the array direction of the pixels of the camera and the extending direction of the groove.

FIG. 5 is a flowchart illustrating a method of aligning the array direction $A_P$ of the pixels of the camera 18 with the extending direction $A_G$ of the groove G.

First, the groove direction detector 104 detects the extending direction $A_G$ of the groove G from the image (first image) $P_0$ of wafer W (step S10). The controller 102 then detects an inclination angle θ of the extending direction $A_G$ of the groove G with respect to the array direction $A_P$ of the pixels of the camera 18 (step S12).

The controller 102 then uses the rotation drive unit 50 to rotate the table T by the inclination angle θ (step S14). As a result, the array direction $A_P$ of the pixels is adjusted to be parallel to the extending direction $A_G$ of the groove G.

In the example illustrated in FIGS. 3 to 5, the table T is rotated with respect to the camera 18. However, the imaging surface 22 of the camera 18 may be rotated instead, or both the table T and the imaging surface 22 may be made rotatable. In other words, the imaging surface 22 of the camera 18 and the table T (wafer W) may be rotated relatively.

In the present embodiment, alignment is performed by relative rotation of the camera 18 and the table T, though the alignment process by relative rotation can be omitted. For example, in the case where the extending direction $A_G$ of the groove G detected by the groove direction detector 104 is set to the direction of one-dimensional conversion, and if alignment is performed on the software, the alignment process by relative rotation can be omitted.

Figure 6:
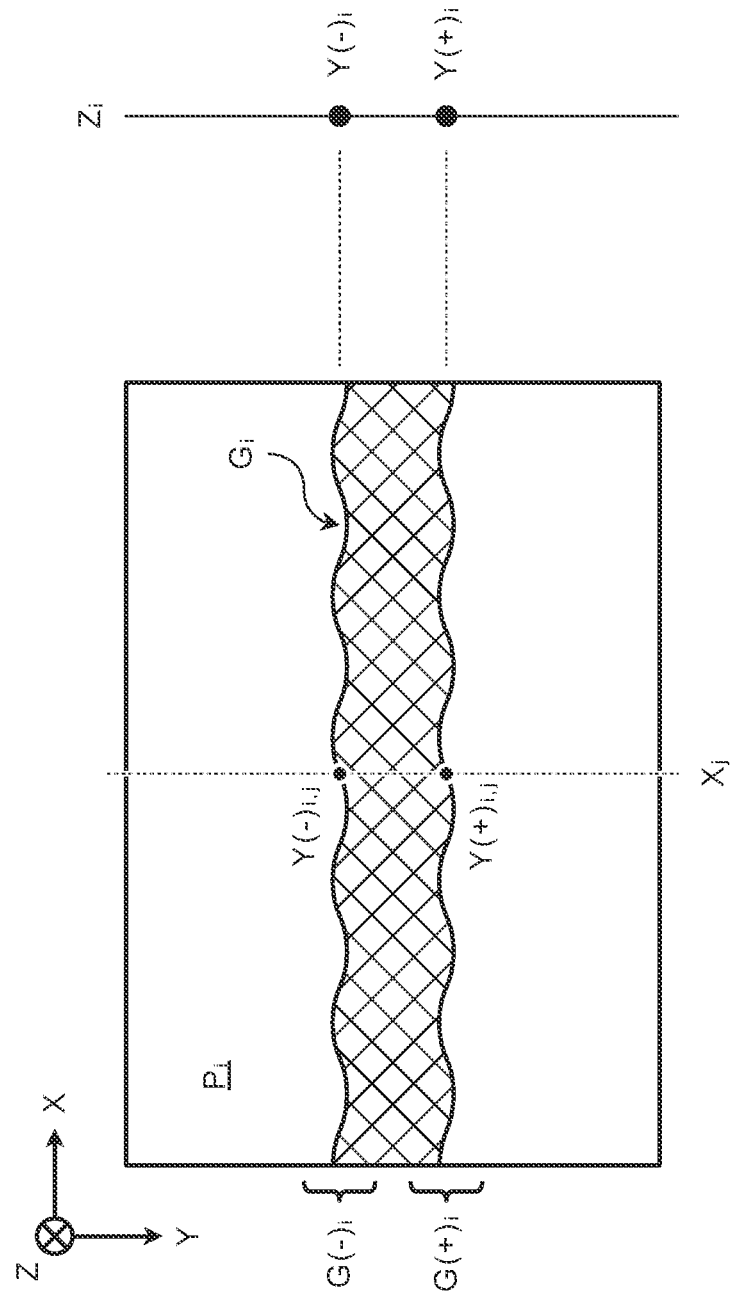
FIG. 6 is an explanatory view of a method of one-dimensional conversion of an image.

FIG. 6 illustrates a method of one-dimensional conversion of the image $P_i$ picked up at the position $Z_i$ in the Z direction. In FIG. 6, the extending direction of a groove $G_i$ is parallel to the X direction, and the depth direction of the groove $G_i$ is the Z direction. And, i=0 indicates the surface of wafer W, and the depth is larger (closer to +Z side) in order of i=1, 2, . . . .

In FIG. 6, as in the case of FIGS. 3 and 4, for the convenience of description, a region deeper than the in-focus position on the wall surfaces of the groove $G_i$ is illustrated as a strip-shaped region.

In the present embodiment, the controller 102 acquires, from the camera 18, the image (second image) $P_i$ of the groove G for each position $Z_i$ in the Z direction. As illustrated in FIG. 6, the controller 102 calculates, for each position $X_j$ of the image $P_i$ in the X direction, Y coordinates $Y(+)_{i,j}$ and $Y(-)_{i,j}$ of the positions where the brightness is maximum (j=0, 1, . . . , m).

Next, the controller 102 calculates mean values (arithmetic mean values) $Y(+)_i$ and $Y(-)_i$ of $Y(+)_{i,j}$ and $Y(-)_{i,j}$ according to the following expressions (1) and (2). The mean values $Y(+)_i$ and $Y(-)_i$ are used as the positions of both the edges of the groove $G_i$ at the depth $Z_i$ to generate one-dimensional data including the mean values $Y(+)_i$ and $Y(-)_i$ for each position $Z_i$ in the Z direction. Here, the controller 102 functions as a one-dimensional data acquisition unit.

[Expression 1]

$$Y(+)_i = \frac{Y(+)_{i,0} + Y(+)_{i,1} + \cdots + Y(+)_{i,m}}{m+1} \quad (1)$$

$$Y(-)_i = \frac{Y(-)_{i,0} + Y(-)_{i,1} + \cdots + Y(-)_{i,m}}{m+1} \quad (2)$$

In the present embodiment, the positions of both the edges of the groove $G_i$ at the depth $Z_i$ are obtained from arithmetic mean values, though the presently disclosed subject matter is not limited to this. For example, other methods of calculating mean values, such as geometric mean or harmonic mean may be used, or representative values other than the mean values, namely central values (median values), may also be used.

There may be a case where, for example, some pixels (noise) with high brightness may be present at the position away from regions $G(+)_i$ and $G(-)_i$ in the vicinity of both the wall surfaces of the groove $G_i$ in FIG. 6. For this reason, the effect of such noise may be eliminated when obtaining the representative values $Y(+)_i$ and $Y(-)_i$. Specifically, the pixels distanced by a prescribed value or more from the representative values (e.g., central values) of the Y coordinates $Y(+)_{i,j}$ and $Y(-)_{i,j}$ which are obtained from respective regions $G(+)_i$ and $G(-)_i$, or the pixels deviating by a prescribed percentage or more from a Y-direction size of the image $P_i$ may be removed in advance from calculation of the representative values. The method of removing noise is not limited to the above method.

Figure 7:
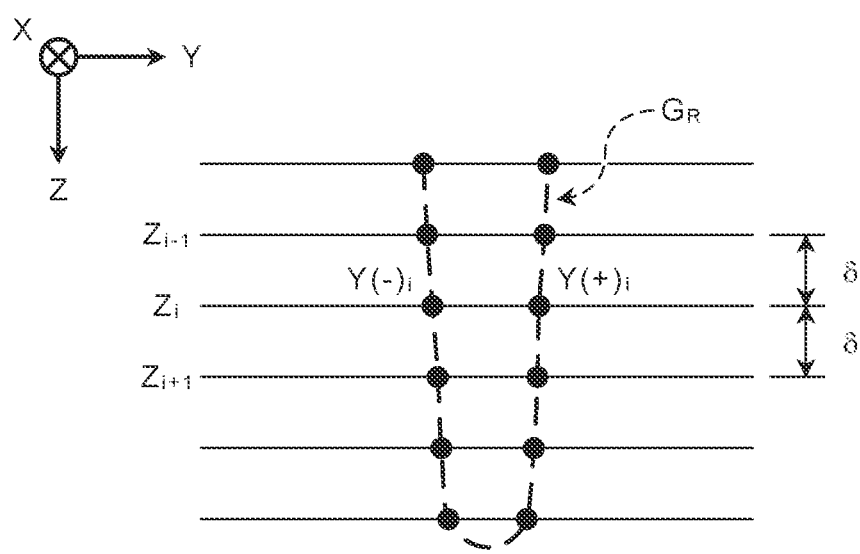
FIG. 7 illustrates a cross-sectional shape of the groove.

FIG. 7 illustrates the cross-sectional shape of the groove G. As illustrated in FIG. 7, the cross-sectional shape generator 106 uses Y-direction positions $Y(+)_i$ and $Y(-)_i$ on the wall surfaces of the groove $G_i$ calculated for each Z-direction position $Z_i$ to generate a cross-sectional shape $G_R$ of the groove G. The cross-sectional shape $G_R$ of the groove G can be obtained by approximation, such as least squares approximation or polynomial approximation, using Y-direction positions $Y(+)_i$ and $Y(-)_i$ corresponding to the Z-direction position $Z_i$.

When the cross-sectional shape $G_R$ of the groove G is generated by approximation, it may be considered as a condition of constraint that the curve of the cross-sectional shape $G_R$ passes through each of the points $Y(+)_i$ and $Y(-)_i$ or the curve does not deviate by a prescribed value or more from each of the points $Y(+)_i$ and $Y(-)_i$.

As described above, in the present embodiment, the cross-sectional shape $G_R$ of the groove G can be generated from the one-dimensional data including the representative values $Y(+)_i$ and $Y(-)_i$ for each position $Z_i$ in the Z direction, as illustrated in FIG. 6. This makes it possible to reduce the data used to generate the cross-sectional shape $G_R$ of the groove G, so that the storage capacity for data accumulation can be reduced, and a processing system with high processing capacity is not required.

According to the present embodiment, since the image $P_i$ is converted to a one-dimensional image along the extending direction of the groove $G_i$, there is a high possibility that some place in the extending direction of the groove $G_i$ is focused even when the wall surfaces of the groove $G_i$ are steep. Hence, data loss is reduced, and a three-dimensional accurate shape of the groove G can be generated.

Here, the method of converting the two-dimensional image $P_i$ into one-dimensional image is not limited to the method of obtaining the representative values along the extending direction (X direction) of the groove $G_i$ (e.g., averaging method). In other words, any method can be used as long as the two-dimensional image $P_i$ can be compressed along the extending direction (X direction) of the groove $G_i$. For example, pixel values (brightness values) of the two-dimensional image $P_1$ may be integrated in the X direction as illustrated in the modification 1.

Figure 8:
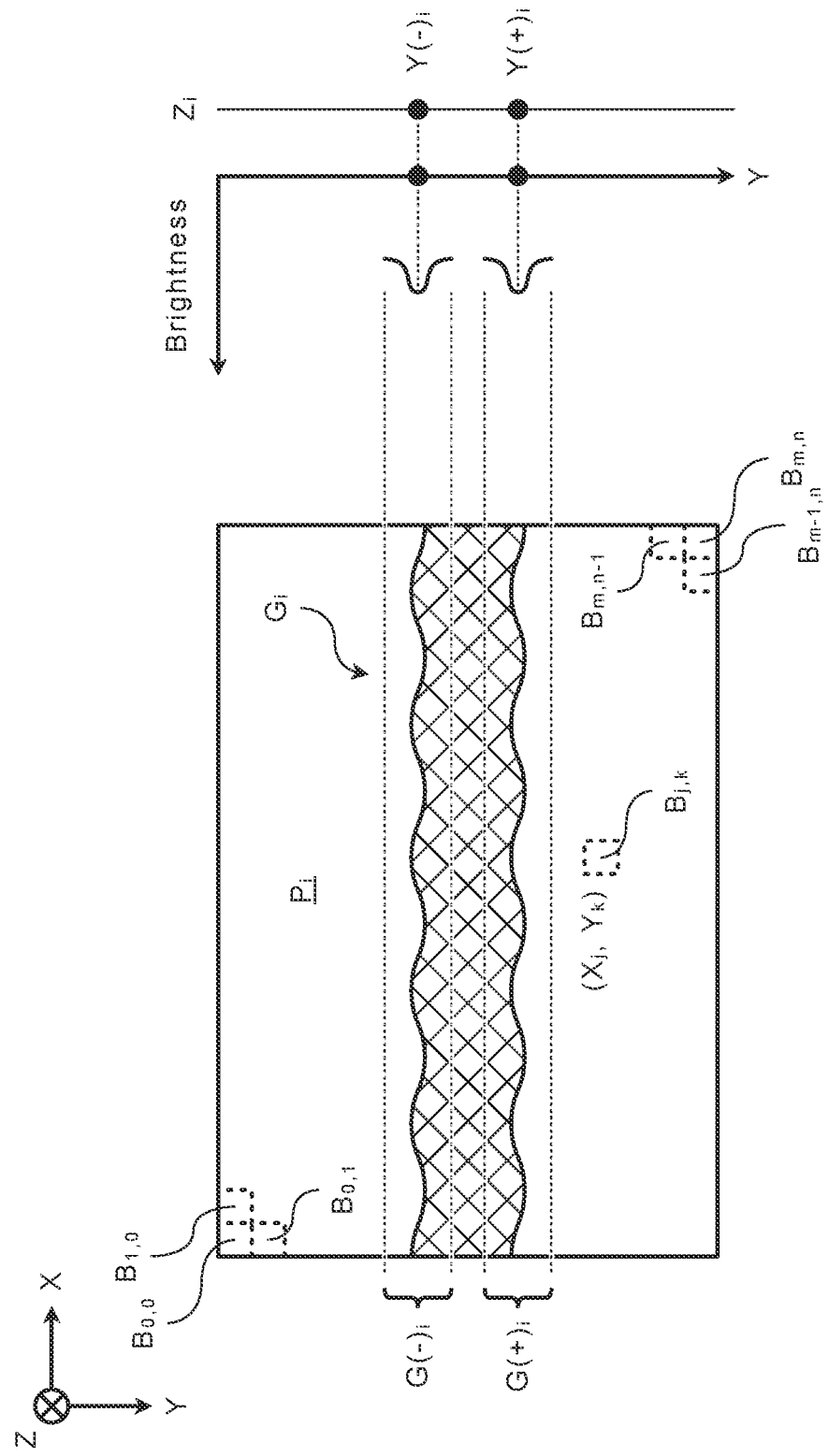
FIG. 8 is an explanatory view of a method of one-dimensional conversion of an image according to a modification 1.

FIG. 8 illustrates a method of converting the image $P_1$ into a one-dimensional image according to the modification 1. In FIG. 8, as in the case of FIG. 6, a region deeper than the in-focus position on the wall surfaces of the groove $G_i$ is illustrated as a strip-shaped black region.

In the modification 1, pixel values (brightness values) of the two-dimensional image $P_i$ are integrated in the X direction. In the two-dimensional image $P_i$, when the pixel value (brightness values) at a position $(X_j, Y_k)$ is $B_{j,k}$, an integrated value $B_k$ of the pixel value $B_{j,k}$ along the X direction is expressed by an expression (3) below.

$$B_k = B_{0,k} + B_{1,k} + \ldots + B_{j,k} + \ldots + B_{m,k} \quad (3)$$

As a result of calculating and plotting the integrated value $B_k$ for each position $Y_K$ in the Y direction, a graph of the integrated value of the brightness values illustrated in FIG. 8 is obtained.

In the modification 1, the controller 102 obtains, as the positions of both the edges of the groove $G_i$ at the depth $Z_i$, the Y-direction positions $Y_K$ ($Y(+)_i$ and $Y(-)_i$) where the integrated value $B_k$ is a local maximum, in the regions $G(+)_i$ and $G(-)_i$ in the vicinity of both the wall surfaces of the groove $G_i$.

In the modification 1, the integrated value $B_k$ for each position $Y_K$ in the Y direction may be used as the one-dimensional data. As in the example illustrated in FIG. 6, the Y- direction positions $Y(+)_i$ and $Y(-)_i$, where the integrated value $B_k$ is a local maximum at the depth $Z_i$, may be used as the one-dimensional data.

In the modification 1, the cross-sectional shape $G_R$ of the groove G can be generated by obtaining the positions of both the edges $Y(+)_i$ and $Y(-)_i$ of the groove $G_i$ from the integrated value $B_k$ at the depth $Z_i$, as in the example illustrated in FIG. 7.

In the modification 1, it is not necessary to calculate the integrated value $B_k$ for all the regions of the image $P_i$, and therefore the integrated value $B_k$ may be calculated only for the regions minimum necessary to obtain the positions of both the edges of the groove $G_i$ at the depth $Z_i$. For example, the integrated value $B_k$ may be calculated only for the regions $G(+)_i$ and $G(-)_i$ in the vicinity of both the wall surfaces of the groove $G_i$.

Although the integrated value of the pixel values is obtained in the modification 1, a mean value of the pixel values along the X direction (for example, an arithmetic mean value) may be obtained to determine the position where the mean value is a local maximum.

Figure 9:
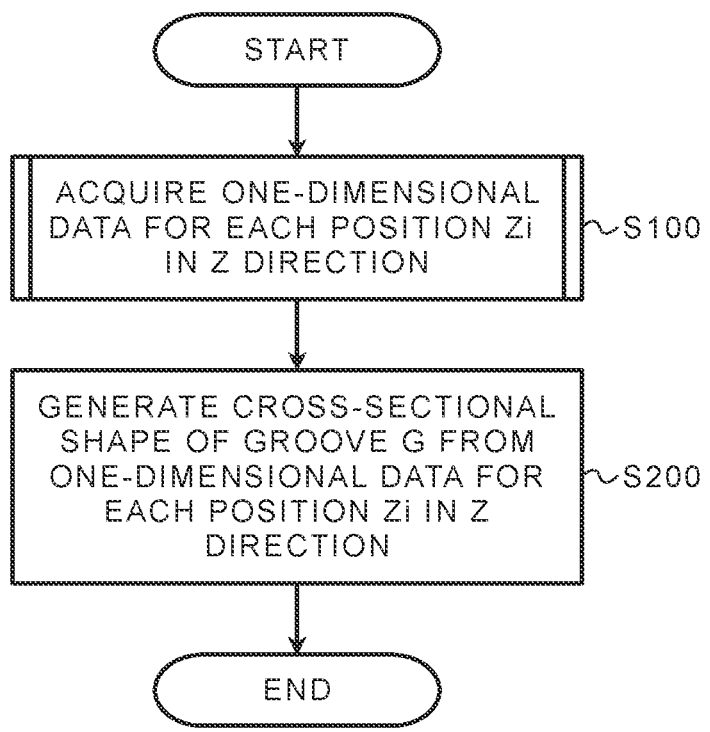
FIG. 9 is a flowchart illustrating a shape measuring method according to an embodiment of the presently disclosed subject matter.
Figure 10:
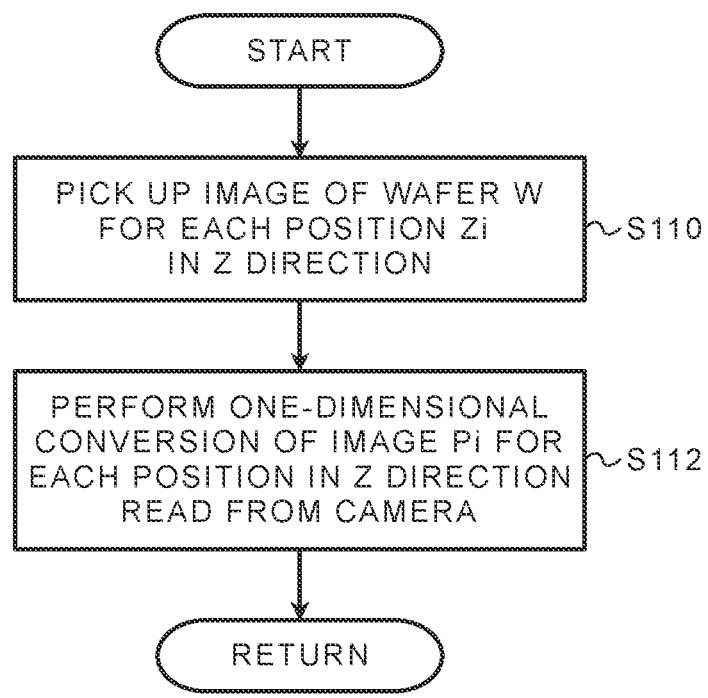
FIG. 10 is a flowchart illustrating the process of one-dimensional conversion of an image.

FIG. 9 is a flowchart illustrating the shape measuring method according to an embodiment of the presently disclosed subject matter. FIG. 10 is a flowchart illustrating the process of one-dimensional conversion of the image $P_i$ (step S100 in FIG. 9).

First, the cross-sectional shape generator 106 acquires one-dimensional data including the positions $Y(+)_i$ and $Y(-)_i$ in the Y direction of both the edges of the groove $G_i$ at the depth $Z_i$, from the two-dimensional image $P_i$ picked up for each position $Z_i$ in the Z direction (step S100).

In step S100, as illustrated in FIG. 10, the camera 18 is first made to perform scanning in the Z direction to pick up the image $P_i$ in the range including the groove G of the wafer W for each position $Z_i$ (i=0,1, . . . ) in the Z direction (step S110). Then, the cross-sectional shape generator 106 performs one-dimensional conversion of the two-dimensional image $P_i$ read from the camera 18 (step S112).

In step S112, for example, as illustrated in FIG. 6, the cross-sectional shape generator 106 obtains the Y coordinates $Y(+)_{i,j}$ and $Y(-)_{i,j}$ having a maximum brightness for each position $X_j$ in the X direction to calculate the representative values $Y(+)_{i,j}$ and $Y(-)_{i,j}$ (for example, arithmetic average values). Alternatively, as illustrated in FIG. 8, the cross-sectional shape generator 106 integrates the pixel values (brightness values) of the image $P_i$ in the X direction, and obtains the Y-direction positions $Y(+)_i$ and $Y(-)_i$ where the integrated value is a local maximum, as the positions of both the edges of the groove $G_i$ at the depth $Z_i$. As a result, the one-dimensional data including the Y-direction positions $Y(+)_i$ and $Y(-)_i$ of both the edges of the groove $G_i$ at the depth $Z_i$ is generated.

Next, the cross-sectional shape generator 106 uses the Y-direction positions $Y(+)_i$ and $Y(-)_i$ of both the edges of the groove $G_i$, which are calculated for each Z-direction position $Z_i$, to generate the cross-sectional shape $G_R$ of the groove G by approximation, such as least squares approximation or polynomial approximation (step S200).

In the present embodiment, the cross-sectional shape generator 106 in the control device 100 performs one-dimensional conversion of the two-dimensional image $P_i$ acquired from the camera 18, though the present embodiment is not limited to this configuration. For example, the camera 18 may perform one-dimensional conversion of the image $P_i$.

When the camera 18 performs one-dimensional conversion of the image $P_i$, the cross-sectional shape generator 106 may be provided in the camera 18, and whenever an image is picked up, the one-dimensional conversion of the image may be performed as illustrated in a modification 2, for example. In the case of obtaining the integrated value of the pixel values along the X direction as in the modification 1, integration may be performed when the image element transfers the pixel values. In the modification 2, since the overall flow of the shape measuring method is similar to that in FIG. 9, only the process of one-dimensional conversion (step S100 in FIG. 9) is described.

Figure 11:
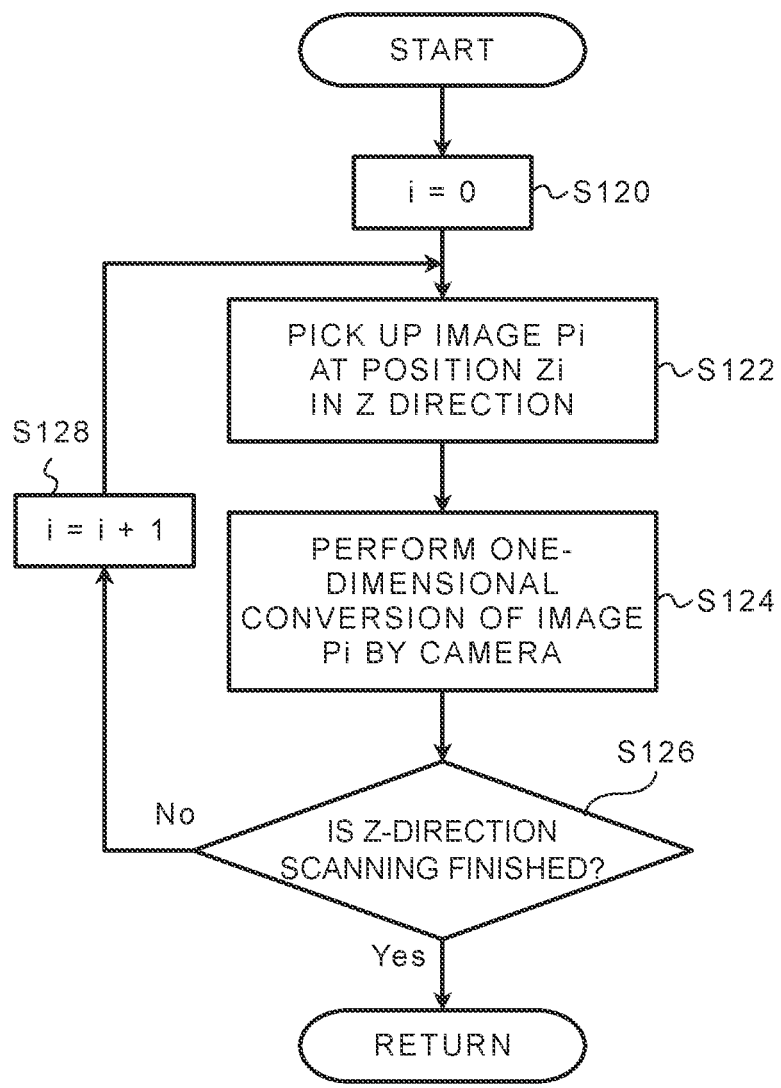
FIG. 11 is a flowchart illustrating the process of one-dimensional conversion of an image according to a modification 2.
Figure 12:
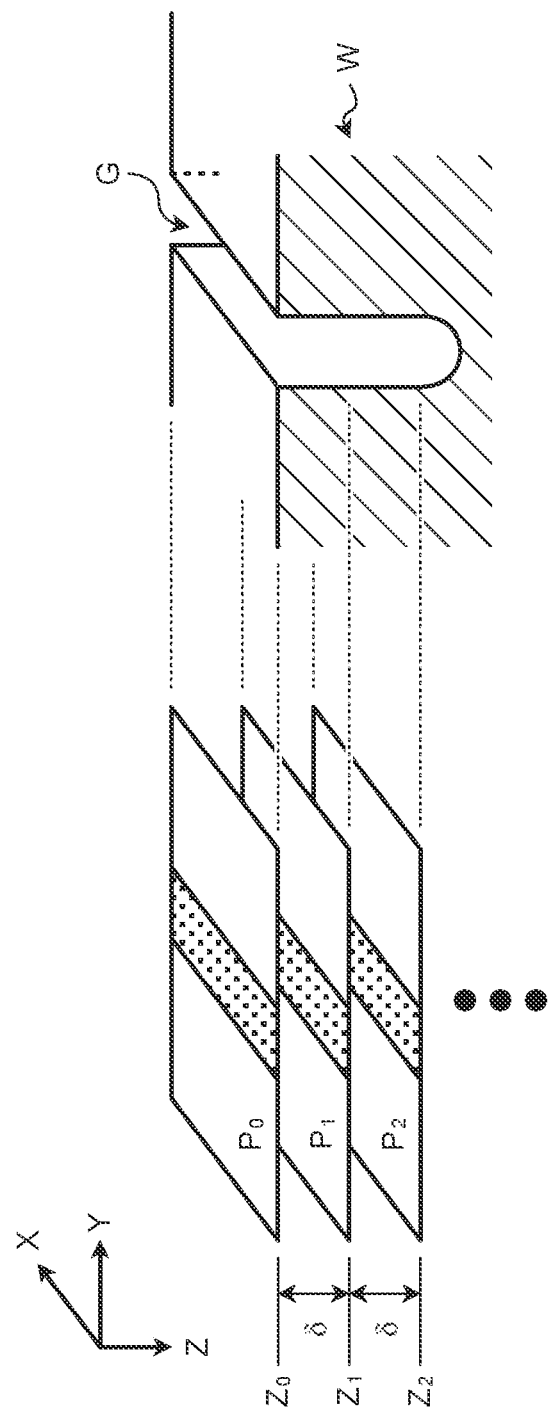
FIG. 12 is an explanatory view of a method of generating a three-dimensional shape of the groove.

FIG. 11 is a flowchart illustrating the process of one-dimensional conversion of an image (step S100 in FIG. 9) according to the modification 2.

As illustrated in FIG. 11, the camera 18 is first made to perform scanning in the Z direction to pick up the image $P_1$ in the position $Z_i$ (i=0) in the Z direction (steps S120 to S122). Then, the camera 18 performs one-dimensional conversion of the image $P_1$ (i=0) (step S124). The method of one-dimensional conversion in step S124 is similar to that in step S112.

Next, the camera 18 performs scanning in the Z direction to pick up the image $P_i$ (i=1) in the position $Z_i$ (i=1) in the Z direction (No in step S126, and steps S128 and S122). The camera 18 performs one-dimensional conversion of the image $P_i$ (i=1) (step S124).

When scanning in the Z direction is finished by repeatedly performing steps S122 to S128 (Yes in step S126), the process of one-dimensional conversion (step S100) is finished.

Although the present embodiment is on the premise that the camera 18 includes the imaging surface 22 in a two-dimensional array pattern, the presently disclosed subject matter is not limited to this configuration. For example, an image of the groove G similar to that in FIG. 6 or FIG. 8 may be obtained by making a line sensor, constituted of one-dimensionally disposed image elements, perform scanning in the X direction.

REFERENCE SIGNS LIST

10 . . . shape measuring apparatus, 12 . . . light source unit, 14 . . . microscope, 16 . . . interferometric lens, 18 . . . camera, 20 . . . half-mirror, 22, 22A . . . imaging surface, 30 . . . beam splitter, 32 . . . reference surface, 34 . . . objective lens, 50 . . . rotation drive unit, 52 . . . X drive unit, 54 . . . Y drive unit, 56 . . . Z drive unit, 100 . . . control device, 102 . . . controller, 104 . . . groove direction detector, 106 . . . cross-sectional shape generator, 108 . . . storage device, 110 . . . input/output unit

What is claimed is:

1. An alignment method, comprising:
    detecting an extending direction of a groove formed on a wafer, based on a first image of the wafer picked up by a camera; and
    performing alignment so as to match the extending direction of the groove with an array direction of pixels of the camera by relatively rotating the wafer and camera.

2. The alignment method according to claim 1, wherein when the alignment is performed, a direction where the number of pixels per unit length is equal to or more than a prescribed value is adjusted to be parallel to the extending direction of the groove.

3. A shape measuring method, comprising generating a cross-sectional shape of a groove, based on a second image of a wafer picked up by a camera after alignment is performed by the alignment method according to claim 1.

4. The shape measuring method according to claim 3, further comprising generating one-dimensional data obtained by one-dimensionally converting the second image of the wafer, picked up by the camera after the alignment is performed, along an extending direction of the groove, wherein
    the cross-sectional shape of the groove is generated based on the one-dimensional data for each position in a depth direction of the groove.

5. A shape measuring apparatus, comprising:
    a detector configured to detect an extending direction of a groove formed on a wafer, based on a first image of the wafer picked up by a camera;
    a controller configured to perform alignment so as to match the extending direction of the groove with an array direction of pixels of the camera by relatively rotating the wafer and camera; and
    a cross-sectional shape generator configured to generate a cross-sectional shape of the groove based on a second image of the wafer picked up by the camera after the alignment is performed.

* * * * *